(12) United States Patent
Liao et al.

(10) Patent No.: US 9,856,382 B2
(45) Date of Patent: Jan. 2, 2018

(54) HOMOGENEOUS COATING SOLUTION AND PRODUCTION METHOD THEREOF, LIGHT-ABSORBING LAYER OF SOLAR CELL AND PRODUCTION METHOD THEREOF, AND SOLAR CELL AND PRODUCTION METHOD THEREOF

(71) Applicant: TOKYO OHKA KOGYO CO., LTD., Kawasaki-shi (JP)

(72) Inventors: Yueh Chun Liao, Kawasaki (JP); Takuya Ohhashi, Kawasaki (JP); Hiroyuki Iida, Kawasaki (JP); Akimasa Nakamura, Kawasaki (JP)

(73) Assignee: TOKYO OHKA KOGYO CO. LTD., Kawasaki-shi (JP)

( * ) Notice: Subject to any disclaimer, the term of this patent is extended or adjusted under 35 U.S.C. 154(b) by 0 days.

(21) Appl. No.: 15/511,189

(22) PCT Filed: Oct. 27, 2015

(86) PCT No.: PCT/JP2015/080296
§ 371 (c)(1),
(2) Date: Mar. 14, 2017

(87) PCT Pub. No.: WO2016/068155
PCT Pub. Date: May 6, 2016

(65) Prior Publication Data
US 2017/0306169 A1    Oct. 26, 2017

(30) Foreign Application Priority Data

Oct. 30, 2014  (JP) .................................. 2014-221682
Jun. 2, 2015  (JP) .................................. 2015-112555

(51) Int. Cl.
*H01L 21/00* (2006.01)
*C09D 5/32* (2006.01)
(Continued)

(52) U.S. Cl.
CPC ............. *C09D 5/32* (2013.01); *C01G 15/006* (2013.01); *C09D 1/00* (2013.01); *C09D 5/24* (2013.01);
(Continued)

(58) Field of Classification Search
CPC . C09D 1/00; C09D 5/24; C09D 7/001; C01G 15/006; H01L 31/1864; H01L 31/0322; H01L 31/0749; H01L 31/022425; H01L 31/0326
See application file for complete search history.

(56) References Cited

U.S. PATENT DOCUMENTS 7,094,651 B2  8/2006  Mitzi et al.
8,765,518 B1  7/2014  Todorov
(Continued)

FOREIGN PATENT DOCUMENTS

JP   A-2004-047860   2/2004
JP   A-2011-508439   3/2011
(Continued)

OTHER PUBLICATIONS

International Search Report in International Application No. PCT/JP2015/080296, dated Dec. 15, 2015.
(Continued)

*Primary Examiner* — Richard Booth
(74) *Attorney, Agent, or Firm* — Knobbe Martens Olson & Bear LLP (57) ABSTRACT

A homogeneous coating solution for forming a light-absorbing layer of a solar cell, the homogeneous solution including: at least one metal or metal compound selected from the group consisting of a group 11 metal, a group 13 metal, a group 11 metal compound and a group 13 metal compound; a Lewis base solvent; and a Lewis acid.

26 Claims, 1 Drawing Sheet (51) Int. Cl.
  *C09D 1/00* (2006.01)
  *C09D 5/24* (2006.01)
  *C09D 7/00* (2006.01)
  *C01G 15/00* (2006.01)
  *H01L 31/18* (2006.01)
  *H01L 31/032* (2006.01)
  *H01L 31/0749* (2012.01)
  *H01L 31/0224* (2006.01)

(52) U.S. Cl.
  CPC ...... *C09D 7/001* (2013.01); *H01L 31/022425* (2013.01); *H01L 31/0322* (2013.01); *H01L 31/0749* (2013.01); *H01L 31/1864* (2013.01); *H01L 31/0326* (2013.01)

(56) References Cited

U.S. PATENT DOCUMENTS

| | | |
|---|---|---|
| 2011/0008927 A1 | 1/2011 | Huang et al. |
| 2012/0280185 A1 | 11/2012 | Liao |
| 2012/0282730 A1 | 11/2012 | Liao et al. |
| 2012/0288987 A1 | 11/2012 | Radu et al. |
| 2012/0319244 A1 | 12/2012 | Oguri et al. |
| 2013/0312831 A1 | 11/2013 | Mitzi et al. |
| 2014/0117293 A1 | 5/2014 | Kuwahara et al. |

FOREIGN PATENT DOCUMENTS

| | | |
|---|---|---|
| JP | A-2011-210793 | 10/2011 |
| JP | A-2011-233700 | 11/2011 |
| JP | A-2013-512311 | 4/2013 |
| JP | A-2013-216888 | 10/2013 |
| KR | 10-2013-0056112 | 5/2013 |
| WO | WO 2011/084171 A1 | 7/2011 |
| WO | WO 2011/093278 A1 | 8/2011 |

OTHER PUBLICATIONS

Search Report in European application No. 15854772.9, dated Jul. 20, 2017.

Office Action in Korean Patent Application No. 10-2017-7008122, dated Apr. 26, 2017.

HOMOGENEOUS COATING SOLUTION AND PRODUCTION METHOD THEREOF, LIGHT-ABSORBING LAYER OF SOLAR CELL AND PRODUCTION METHOD THEREOF, AND SOLAR CELL AND PRODUCTION METHOD THEREOF

TECHNICAL FIELD

The present invention relates to a homogeneous coating solution and production method thereof, a light-absorbing layer of a solar cell and production method thereof, and a solar cell and a production method thereof.

Priority is claimed on Japanese Patent Application No. 2014-221682, filed Oct. 30, 2014, and Japanese Patent Application No. 2015-112555, filed Jun. 2, 2015, the contents of which are incorporated herein by reference.

DESCRIPTION OF RELATED ART

In recent years, in consideration of environment, solar cells have been attracting a growing interest. In particular, attention has been drawn to chalcopyrite solar cells which are thin-film solar cells with high photoelectric conversion efficiency, and also kesterite solar cells in which a rare metal, indium, is substituted with another environmentally friendly metal, and hence, research and development have been actively conducted.

A chalcopyrite solar cell is produced by forming a light absorbing layer prepared from a chalcopyrite material on a substrate. Representative elements of a chalcopyrite material include copper (Cu), indium (In), gallium (Ga), selenium (Se) and sulfur (S), and representative examples of a light absorbing layer include $Cu(In, Ga)Se_2$ and $Cu(In, Ga)(Se, S)_2$, which are abbreviated as CIGS and CIGSSe, respectively. Recently, kesterite solar cell has been studied in which a rare metal indium has been substituted and is composed of, for example, copper (Cu), zinc (Zn), tin (Sn), selenium (Se) and sulfur (S). Representative examples of the light absorbing layer of such a solar cell include $Cu_2ZnSnSe_4$, $Cu_2ZnSnS_4$ and $Cu_2ZnSn(S, Se)_4$.

Figure 1:
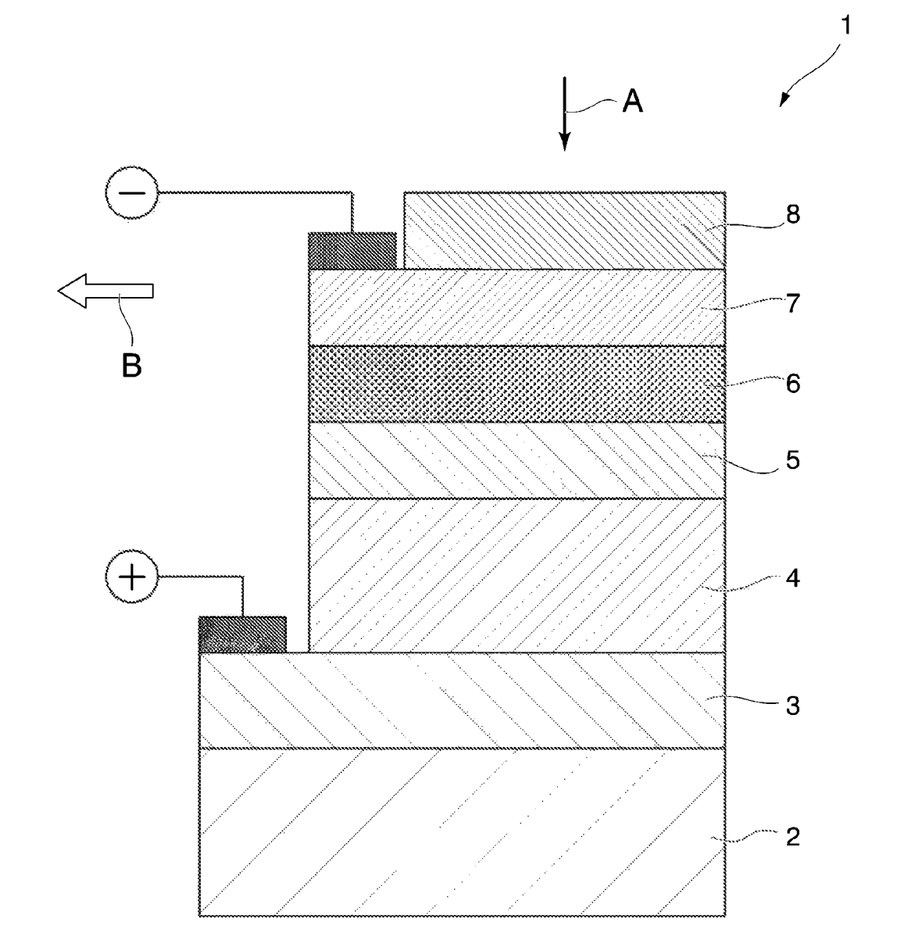
FIG. 1 is a schematic cross-sectional diagram of an example of a chalcopyrite solar cell or a kesterite solar cell.

FIG. 1 is a schematic cross-sectional diagram of an example of a chalcopyrite solar cell or a kesterite solar cell.

As shown in FIG. 1, a chalcopyrite solar cell or a kesterite solar cell 1 has a basic structure in which a first electrode 3, a CIGS or CZTS layer 4, a buffer layer 5, an i-ZnO layer 6 and a second electrode 7 are stacked on a substrate 2 in this order. As the buffer layer, for example, a CdS layer, an ZnS layer and an InS layer are known.

Each of the first electrode 3 and the second electrode 7 has a terminal connected thereto, and each of the terminals is connected to a wiring. In such a chalcopyrite solar cell or a kesterite solar cell 1, an incident light entering in the direction of A is absorbed by the CIGS or CZTS layer 4 to generate an electromotive force, and an electric current flows in the direction of B.

The surface of the second electrode 7 is, for example, covered with an anti-reflection film layer 8 composed of an $MgF_2$ layer for protection.

As a method of forming a CIGS or CZTS layer 4, vacuum-based methods and a coating method are known. However, in the vacuum-based methods, the size of the apparatus tends to be scaled up, thereby deteriorating the yield. Therefore, diligent studies have been made on the coating method which enables production at a relatively low cost.

Generally, in a coating method of a CIGS layer, elements such as Cu, In, Ga, Se and S are dissolved in a specific solvent to prepare a coating solution, and the coating solution is applied to a substrate by a spin coating method or a dipping method or a slit-casting method, followed by baking, thereby forming a CIGS layer.

Patent Literature 1 discloses a method of producing a coating solution by preparing a hydrazine-coordinated metal chalcogenide complex, and dissolving the hydrazine-coordinated metal chalcogenide complex in a solvent containing a dissolution promoter.

Patent Literature 2 discloses a method of producing a coating solution by reacting at least 2 organic compounds containing a metal and chalcogen in the presence of a thiol compound or a selenol compound.

Patent Literature 3 discloses a method of producing a coating solution by reacting a chalcogen element-containing organic compound, a Lewis base and a metal.

Patent Literature 4 discloses a method of producing a coating solution by preparing an aqueous solution containing at least 2 metal salts and at least 1 ligand, and mixing the aqueous solution with a chalcogen source, followed by stirring, thereby obtaining a dispersion of metal chalcogenide nano particles as the coating solution.

Patent Literature 5 discloses a method in which a coating solution is prepared as a dispersion of metal chalcogenide nano particles by using a metal ion and/or a metal complex ion.

DOCUMENTS OF RELATED ART

Patent Literature

[Patent Literature 1] U.S. Pat. No. 7,094,651
[Patent Literature 2] WO2011/0084171
[Patent Literature 3] WO2011/0093278
[Patent Literature 4] Japanese Unexamined Patent Application Publication (Translation of PCT Application) No. 2013-512311
[Patent Literature 5] U.S. Pre-grant Patent Publication No. 2012/0280185

SUMMARY OF THE INVENTION

However, in the preparation of a coating solution, when hydrazine is used, a problem has conventionally been raised in terms of safety of the process due to chemical properties (explosiveness, toxicity) of hydrazine.

In a method using a chalcogen element-containing organic compound as the chalcogen source, although the safety of the process is improved as compared to a method using hydrazine, the amount of organic substance within the coating film may increase. When organic substance remains in the coating film, the organic substance inhibits the crystal growth of the light-absorbing layer, which is unfavorable.

On the other hand, in a method in which a dispersion of metal chalcogenide nano particles is prepared as a coating solution, the metal chalcogenide nano particles are precipitated, and hence, a dispersant becomes necessary. However, when the dispersant remains in the coating film, the dispersant inhibits the crystal growth of the light-absorbing layer, which is unfavorable.

In view of these problems, there have been demands for a method of producing a coating solution for forming a light-absorbing layer of a solar cell by using metals as raw materials. However, such an effective, suitable method has not been proposed under these circumstances.

The present invention takes the above circumstances into consideration, with an object of providing a homogeneous coating solution and a production method thereof which are advantageous in terms of high level of safety, low cost, and forming a light-absorbing layer containing high quality crystals.

For solving the above-mentioned problems, the present invention employs the following embodiments.

(1) A homogeneous coating solution for forming a light-absorbing layer of a solar cell, the homogeneous solution including: at least one metal or metal compound selected from the group consisting of a group 11 metal, a group 13 metal, a group 11 metal compound and a group 13 metal compound; a Lewis base solvent; and a Lewis acid.

(2) The homogeneous coating solution according to (1) above, wherein the solar cell is a chalcopyrite solar cell.

(3) The homogeneous coating solution according to (1) or (2) above, which includes a compound represented by general formula (1) shown below:

[Chemical Formula 1]

$$Cu_w(In_{1-x}Ga_x)_y(A)_z \qquad (1)$$

wherein $0 \leq w \leq 1$, $0 \leq x \leq 1$, $0 \leq y \leq 1$, $0 < z \leq 2$, and A is at least one group 16 element.

(4) The homogeneous coating solution according to any one of (1) to (3) above, wherein the Lewis base solvent is an aprotic solvent.

(5) The homogeneous coating solution according to (4) above, wherein the aprotic solvent is at least one member selected from the group consisting of dimethylsulfoxide, pyridine, tetramethylurea, tetrahydrofuran, ethyl acetate, acetone, dimethylformamide, acetonitrile, dichloromethane, dimethylacetoamide, N-methylpyrrolidone and N-methylimidazole.

(6) The homogeneous coating solution according to any one of (1) to (5) above, wherein the Lewis acid is an onium salt.

(7) The homogeneous coating solution according to (6) above, wherein the Lewis acid is an ammonium salt.

(8) The homogeneous coating solution according to (7) above, wherein the ammonium salt is at least one member selected from the group consisting of ammonium hydroxide, ammonium sulfide, ammonium chloride, ammonium carbonate, ammonium selenide, ammonium thiocyanate, ammonium acetate, ammonium carbamate, ammonium formate, ammonium hexafluorophosphate, ammonium hydrogen difluoride and ammonium nitrate.

(9) The homogeneous coating solution according to any one of (1) to (8) above, which further includes a group 16 element.

(10) The homogeneous coating solution according to (9) above, wherein the group 16 element is at least one member selected from the group consisting of S and Se.

(11) The homogeneous coating solution according to any one of (1) to (10) above, further including at least one member selected from the group consisting of Li, Na, K, Cs, Sb and Bi.

(12) A light-absorbing layer of a solar cell formed by using the homogeneous coating solution according to any one of (1) to (11) above.

(13) A solar cell including the light-absorbing layer of (12) above.

(14) A method of producing a homogeneous coating solution for forming a light-absorbing layer of a solar cell, the method including: mixing together at least one metal or metal compound selected from the group consisting of a group 11 metal, a group 13 metal, a group 11 metal compound and a group 13 metal compound, a Lewis base solvent, and a Lewis acid.

(15) The method according to (14) above, wherein the solar cell is a chalcopyrite solar cell.

(16) The method according to (14) or (15) above, wherein the homogeneous coating solution comprises a compound represented by general formula (1) shown below:

[Chemical Formula 2]

$$Cu_w(In_{1-x}Ga_x)_y(A)_z \qquad (1)$$

wherein $0 \leq w \leq 1$, $0 \leq x \leq 1$, $0 \leq y \leq 1$, $0 \leq z \leq 2$, and A is at least one group 16 element.

(17) The method according to any one of (14) to (16) above, wherein the Lewis base solvent is an aprotic solvent.

(18) The method according to (17) above, wherein the aprotic solvent is at least one member selected from the group consisting of dimethylsulfoxide, pyridine, tetramethylurea, tetrahydrofuran, ethyl acetate, acetone, dimethylformamide, acetonitrile, dichloromethane, dimethylacetoamide, N-methylpyrrolidone and N-methylimidazole.

(19) The method according to any one of (14) to (18) above, wherein the Lewis acid is an onium salt.

(20) The method according to (19) above, wherein the Lewis acid is an ammonium salt.

(21) The method according to (20) above, wherein the ammonium salt is at least one member selected from the group consisting of ammonium hydroxide, ammonium sulfide, ammonium chloride, ammonium carbonate, ammonium selenide, ammonium thiocyanate, ammonium acetate, ammonium carbamate, ammonium formate, ammonium hexafluorophosphate, ammonium hydrogen difluoride and ammonium nitrate.

(22) The method according to any one of (14) to (21) above, further including mixing a group 16 element.

(23) The method according to (22) above, wherein the group 16 element is at least one member selected from the group consisting of S and Se.

(24) The method according to any one of (14) to (23) above, further including adding at least one member selected from the group consisting of Li, Na, K, Cs, Sb and Bi.

(25) A method of forming a light-absorbing layer of a solar cell, the method including: applying a homogeneous coating solution obtained by the method according to any one of (14) to (24) above to a base, followed by baking.

(26) A method of producing a solar cell, the method including: forming a first electrode on a substrate; applying a homogeneous coating solution obtained by the method according to any one of (14) to (24) above to the first electrode, followed by baking to form a light-absorbing layer; forming a buffer layer on the light-absorbing layer; and forming a second electrode on the buffer layer.

According to the present invention, there are provided a homogeneous coating solution and a production method thereof which are advantageous in terms of high level of safety, low cost, and forming a light-absorbing layer containing high quality crystals.

DETAILED DESCRIPTION OF THE INVENTION

[Homogeneous Coating Solution and Production Method Thereof]

Hereinbelow, the homogeneous coating solution and production method thereof according to the present embodiment will be described.

A homogeneous coating solution according to the present embodiment is usable for forming a light-absorbing layer of a solar cell, the homogeneous solution including: at least one metal or metal compound selected from the group consisting of a group 11 metal, a group 13 metal, a group 11 metal compound and a group 13 metal compound (hereafter, sometimes collectively referred to as "metal and/or metal compound"); a Lewis base solvent; and a Lewis acid.

In the present specification and claims, a "homogeneous solution" refers to a solution in which the solute (metal and/or metal compound, Lewis acid, group 16 element and any optional component) is homogeneously dissolved over the entire solvent (Lewis base solvent and any optional solvent), and does not include a dispersion solution in which metal particles and/or metal compound particles are dispersed in the solvent.

Examples of the group 11 metal include Cu element and Ag element. Among these examples, Cu element is particularly desirable.

Examples of the group 13 metal include Al element, Ga element and In element. Among these examples, Ga element and In element are particularly desirable.

Examples of the group 11 metal compound include $Cu(OH)_2$, CuS, $Cu_2S$, $Cu_2Se$, CuSe, $Cu_2Te$, CuTe, CuO, $Cu_2O$, silver oxide, silver sulfide, and silver selenide.

Examples of the group 13 metal compound include $In(OH)_3$, indium oxide, indium sulfide, indium selenide, indium telluride, gallium oxide, gallium sulfide, gallium selenide, gallium telluride, boric acid and boron oxide.

Among these examples, Cu element, Ag element, Al element, Ga element, In element, $Cu(OH)_2$, CuO, $Cu_2O$, silver oxide, $In(OH)_3$, indium oxide and gallium oxide are preferable, and Cu element, Ga element and In element are more preferable.

As the metal and/or compound, one kind of compound may be used, or two or more kinds of compounds may be used in combination.

The Lewis base solvent is not particularly limited, as long as it is a substance capable of dissolving the metal and/or metal compound, the Lewis acid, the group 16 element and any optional component, and donating an electron pair.

As the Lewis base solvent, an aprotic solvent is preferable. Examples of the aprotic solvent include dimethylsulfoxide, pyridine, tetramethylurea, tetrahydrofuran, ethyl acetate, acetone, dimethylformamide, acetonitrile, dichloromethane, dimethylacetoamide, N-methylpyrrolidone and N-methylimidazole.

Among these examples, dimethylsulfoxide or tetramethylurea is preferable, and dimethylsulfoxide is more preferable.

As the Lewis base solvent, one type of compound may be used alone, or two or more types of compounds may be used in combination.

The Lewis acid is not particularly limited as long as it is a substance capable of accepting an electron pair.

As the Lewis acid, an onium salt is preferable. Examples of onium salt include an ammonium salt [$(NH_4)^+$], a phosphonium salt [$(PH_4)^+$], a sulfonium salt [$(H_3S)^+$], a methanium salt [$(CH_5)]^+$, a boronium salt [$(BH_3)^+$, $(BH_4)^+$, $(BH_5)^+$, $(BH_6)^+$], a disilanium salt [$(Si_2H_7)^+$] and a germonium salt [$(GeH_5)^+$] can be mentioned. Among these examples, an ammonium salt is preferable.

Examples of ammonium salt include ammonium hydroxide, ammonium sulfide, ammonium chloride, ammonium carbonate, ammonium selenide, ammonium thiocyanate, ammonium acetate, ammonium carbamate, ammonium formate, ammonium hexafluorophosphate, ammonium hydrogen difluoride and ammonium nitrate. Among these examples, ammonium hydroxide, ammonium sulfide or a combination thereof is preferable.

As the Lewis acid, one type of compound may be used alone, or two or more types of compounds may be used in combination.

The homogeneous coating solution according to the present embodiment may include a group 16 element. Examples of group 16 element include O, S, Se and Te. As the group 16 element, at least one member selected from the group consisting of S and Se is preferable, and Se is most preferable.

As the group 16 element, one type of element may be used alone, or two or more types of elements may be used in combination. Alternatively, among the aforementioned metal and/or metal compounds and Lewis acid, compounds containing a group 16 element may be used.

In the present embodiment, the homogeneous solution may contain a solvent other than Lewis base solvent (hereafter, referred to as "optional solvent"). As the optional solvent, water, an alcohol (e.g., methanol, ethanol or propanol), a glycol (e.g., ethylene glycol or propylene glycol) and a glycolether (e.g., methyldiglycol) can be mentioned.

As the optional solvent, one kind of solvent may be used alone, or two or more kinds of solvents may be used in combination.

In the present embodiment, a solvent having a polarity lower than the polarity of the Lewis base solvent (hereafter, sometimes referred to as "poor solvent") may be added to the homogeneous coating solution. By adding a poor solvent, the homogeneous coating solution can be purified, and impurities can be removed. However, in the present invention, such purification step is not always necessary. By omitting such purification step, the entire process of the method can be simplified, which results in industrial advantages.

The poor solvent is not particularly limited as long as it is a solvent having a polarity lower than the polarity of the Lewis base solvent, and acetone and isopropanol is preferable.

The poor solvent may be mixed together with the metal and/or metal compound, the Lewis base solvent, the Lewis acid and optionally the group 16 element in the preparation of the homogeneous coating solution; however, it is preferable to add the poor solvent to the homogeneous coating solution after the preparation thereof. By mixing the poor solvent after preparing the homogeneous coating solution, the objective complex can be precipitated, and impurities such as unreacted S or Se can be removed as a supernatant. The complex and the impurities can be separated by centrifugal separation, filtration, extraction or the like.

After removing the impurities as a supernatant, the complex may be further washed with a poor solvent. By conducting the washing a plurality of times, the impurities can be more reliably removed.

As the poor solvent, one type of solvent may be used alone, or two or more types of solvents may be used in combination.

The homogeneous coating solution according to the present embodiment is obtainable by mixing together the metal and/or metal compound, the Lewis base solvent, the Lewis acid and any optional component. The method of mixing the materials is not particularly limited. For example, in the case where a plurality of metals and/or metal compounds are used, such as in the preparation of a coating solution for forming a light-absorbing layer of a CIGS solar cell, there can be mentioned a method in which each complex solution (hereafter, sometimes referred to as "metal precursor solution") is prepared, followed by mixing together the metal precursor solutions (hereafter, this method is referred to as "preparation method (I)"), a method in which all of the raw materials are mixed together (hereafter, this method is referred to as "preparation method (II)"), and a method in which at least two or more kinds of group 11 metals and/or group 13 metals are used to prepare a binary or ternary metal complex solution (hereafter, this method is referred to as "preparation method (III)").

<Preparation Method (I)>

(Cu Precursor)

A Cu precursor can be obtained, for example, by mixing together a Cu and/or Cu compound, a Lewis base solvent, a Lewis acid and optionally a group 16 element.

As the Cu and/or Cu compound, the Lewis base solvent, the Lewis acid and the group 16 element, the same Cu and/or Cu compounds, Lewis base solvents, Lewis acids and group 16 elements as those described above in relation to the homogeneous coating solution can be used.

As the Cu and/or Cu compound, Cu, $Cu(OH)_2$, CuS, $Cu_2S$, CuO, $Cu_2O$, $Cu_2Se$, CuSe, $Cu_2Te$ and CuTe is preferable, and Cu is more preferable.

As Cu and/or Cu compound, one type of element or compound may be used alone, or two or more types of elements and compounds may be used in combination.

When a group 16 element is used, the amount of the group 16 element per 1 mol of Cu is preferably 0.5 to 15 mol, more preferably 1 to 10 mol, and still more preferably 2 to 5 mol.

The amount of the Lewis acid per 1 mol of Cu is preferably 0.1 to 50 mol, more preferably 1 to 20 mol, and still more preferably 2.5 to 8.5 mol.

The method for mixing together the Cu and/or Cu compound, the Lewis base solvent, the Lewis acid and optionally the group 16 element is not particularly limited. Examples of the method for mixing include a method in which the Cu and/or Cu compound, the Lewis acid and optionally the group 16 element are added to the Lewis base solvent, followed by stirring; a method in which the Cu and/or Cu compound, the Lewis acid and optionally the group 16 element are mixed together to obtain a reaction liquid, followed by addition of the Lewis base solvent to the reaction liquid; and a method in which a poor solvent is added to the reaction liquid to obtain a complex, and the Lewis base solvent is added to the complex. Alternatively, a method in which the Lewis acid and optionally the group 16 element are added to the Lewis base solvent and stirred, followed by addition of the Cu and/or Cu compound is also preferable.

The total amount of the Lewis base solvent and any optional solvent (hereafter, simply referred to as "amount of solvent") is preferably in a range where the Cu concentration at the time of mixing is from 0.1 mol/L to 2.0 mol/L, more preferably from 0.2 mol/L to 1.5 mol/L, and most preferably from 0.4 to 1.2 mol/L.

In the preparation of a Cu precursor, the reaction temperature varies depending on the types of the Cu and/or Cu compound, the Lewis base solvent, the Lewis acid and the group 16 element to be used. However, in general, in terms of safety and stability of the Cu complex, the reaction temperature is preferably from 0° C. to 200° C., more preferably from room temperature to 150° C., and still more preferably from room temperature to 100° C.

Further, in the preparation of a Cu precursor, the reaction time varies depending on the types of the Cu and/or Cu compound, the Lewis base solvent, the Lewis acid and the group 16 element to be used, the stirring time and the reaction temperature. However, in general, the reaction time is preferably from 1 hour to 2 weeks, more preferably from 1 day to 1 week, and still more preferably from 1 to 4 days.

After preparing the Cu precursor, it is preferable to add a solvent having a polarity lower than the polarity of the Lewis base solvent (poor solvent) to the Cu precursor, so as to remove impurities. As the poor solvent, isopropylalcohol is particularly desirable. The mixing of the poor solvent is preferably conducted a plurality of times. Specifically, it is preferable to conduct the mixing of the poor solvent 1 to 5 times.

The amount of the poor solvent relative to the Cu precursor is preferably 2 to 20 times, more preferably 5 to 20 times, and still more preferably 7 to 20 times.

(In Precursor)

An In precursor can be obtained, for example, by mixing together an In and/or In compound, a Lewis base solvent, a Lewis acid and optionally a group 16 element.

As the In and/or In compound, the Lewis base solvent, the Lewis acid and the group 16 element, the same In and/or In compounds, Lewis base solvents, Lewis acids and group 16 elements as those described above in relation to the homogeneous coating solution can be used.

As the In and/or In compound, In, $In(OH)_3$, indium oxide, indium sulfide, indium selenide and indium telluride are preferable, and In, $In(OH)_3$ and indium oxide are more preferable.

As In and/or In compound, one type of element or compound may be used alone, or two or more types of elements and compounds may be used in combination.

When a group 16 element is used, the amount of the group 16 element per 1 mol of In is preferably 0 to 15 mol, more preferably 1 to 10 mol, and still more preferably 2 to 5 mol.

The amount of the Lewis acid per 1 mol of In is preferably 0.1 to 50 mol, more preferably 1 to 20 mol, and still more preferably 2.5 to 8.5 mol.

The method for mixing together the In and/or In compound, the Lewis base solvent, the Lewis acid and optionally the group 16 element is not particularly limited. Examples of the method for mixing include a method in which the In and/or In compound, the Lewis acid and optionally the group 16 element are added to the Lewis base solvent, followed by stirring; a method in which the In and/or In compound, the Lewis acid and optionally the group 16 element are mixed together to obtain a reaction liquid, followed by addition of the Lewis base solvent to the reaction liquid; and a method in which a poor solvent is added to the reaction liquid to obtain a complex, and the Lewis base solvent is added to the complex. Alternatively, a method in which the Lewis acid and optionally the group 16 element are added to the Lewis base solvent and stirred, followed by addition of the In and/or In compound is also preferable.

The amount of the solvent is preferably in a range where the In concentration at the time of mixing is from 0.1 mol/L to 2.0 mol/L, more preferably from 0.2 mol/L to 1.5 mol/L, and most preferably from 0.4 to 1.2 mol/L.

In the preparation of an In precursor, the reaction temperature varies depending on the types of the In and/or In compound, the Lewis base solvent, the Lewis acid and the group 16 element to be used. However, in general, in terms of safety and stability of the In complex, the reaction temperature is preferably from 0° C. to 200° C., more preferably from room temperature to 150° C., and still more preferably from room temperature to 100° C.

Further, in the preparation of a In precursor, the reaction time varies depending on the types of the In and/or In compound, the Lewis base solvent, the Lewis acid and the group 16 element, the stirring time and the reaction temperature. However, in general, the reaction time is preferably from 1 hour to 2 weeks, more preferably from 1 day to 1 week, and still more preferably from 1 to 4 days.

After preparing the In precursor, is preferable to add a solvent having a polarity lower than the polarity of the Lewis base solvent (poor solvent) to the In precursor, so as to remove impurities. As the poor solvent, acetone is particularly desirable. The mixing of the poor solvent is preferably conducted a plurality of times. Specifically, it is preferable to conduct the mixing of the poor solvent 1 to 5 times.

The amount of the poor solvent relative to the In precursor is preferably 2 to 20 times, more preferably 5 to 20 times, and still more preferably 7 to 20 times.

(Ga Precursor)

A Ga precursor can be obtained, for example, by mixing together a Ga and/or Ga compound, a Lewis base solvent, a Lewis acid and optionally a group 16 element.

As the Ga and/or Ga compound, the Lewis base solvent, the Lewis acid and the group 16 element, the same Ga and/or Ga compounds, Lewis base solvents, Lewis acids and group 16 elements as those described above in relation to the homogeneous coating solution can be used.

As the Ga and/or Ga compound, Ga, gallium oxide, gallium sulfide, gallium selenide and gallium telluride are preferable, and Ga and gallium oxide are more preferable.

As Ga and/or Ga compound, one type of element or compound may be used alone, or two or more types of elements and compounds may be used in combination.

When a group 16 element is used, the amount of the group 16 element per 1 mol of Ga is preferably 0 to 15 mol, more preferably 1 to 10 mol, and still more preferably 2 to 5 mol.

The amount of the Lewis acid per 1 mol of Ga is preferably 0.1 to 50 mol, more preferably 1 to 20 mol, and still more preferably 2.5 to 8.5 mol.

The method for mixing together the Ga and/or Ga compound, the Lewis base solvent, the Lewis acid and optionally the group 16 element is not particularly limited. Examples of the method for mixing include a method in which the Ga and/or Ga compound, the Lewis acid and optionally the group 16 element are added to the Lewis base solvent, followed by stirring; a method in which the Ga and/or Ga compound, the Lewis acid and optionally the group 16 element are mixed together to obtain a reaction liquid, followed by addition of the Lewis base solvent to the reaction liquid; and a method in which a poor solvent is added to the reaction liquid to obtain a complex, and the Lewis base solvent is added to the complex. Alternatively, a method in which the Lewis acid and optionally the group 16 element are added to the Lewis base solvent and stirred, followed by addition of the Ga and/or Ga compound is also preferable.

The amount of the solvent is preferably in a range where the Ga concentration at the time of mixing is from 0.1 mol/L to 2.0 mol/L, more preferably from 0.2 mol/L to 1.5 mol/L, and most preferably from 0.4 to 1.2 mol/L.

In the preparation of a Ga precursor, the reaction temperature varies depending on the types of the Ga and/or Ga compound, the Lewis base solvent, the Lewis acid and the group 16 element to be used. However, in general, in terms of safety and stability of the Ga complex, the reaction temperature is preferably from 0° C. to 200° C., more preferably from room temperature to 150° C., and still more preferably from room temperature to 100° C.

Further, in the preparation of a Ga precursor, the reaction time varies depending on the types of the Ga and/or Ga compound, the Lewis base solvent, the Lewis acid and the group 16 element, the stirring time and the reaction temperature. However, in general, the reaction time is preferably from 1 hour to 2 weeks, more preferably from 1 day to 1 week, and still more preferably from 1 to 4 days.

After preparing the Ga precursor, is preferable to add a solvent having a polarity lower than the polarity of the Lewis base solvent (poor solvent) to the Ga precursor, so as to remove impurities. As the poor solvent, acetone is particularly desirable. The mixing of the poor solvent is preferably conducted a plurality of times. Specifically, it is preferable to conduct the mixing of the poor solvent 1 to 5 times.

The amount of the poor solvent relative to the Ga precursor is preferably 2 to 20 times, more preferably 5 to 20 times, and still more preferably 7 to 20 times.

<Preparation Method (II)>

As the metal and/or metal compound, the Lewis base solvent, the Lewis acid and the group 16 element usable in the preparation method (II), the same metal and/or metal compounds, Lewis base solvents, Lewis acids and group 16 elements as those described above in relation to the homogeneous coating solution can be used.

The amount of each raw material can be appropriately adjusted depending on the types of raw materials used. For example, in the case where the coating solution is used in the formation of a light-absorbing layer of a CIGS solar cell (i.e., the homogeneous coating solution includes a compound represented by general formula (1) described later), the homogeneous coating solution can be prepared such that the molar ratio of the metals falls under the range of Cu/(In+Ga)=0.5 to 1.0, In/(In+Ga)=0.0 to 1.0, and Ga/(In+Ga)=0.0 to 1.0.

When a group 16 element is used, the amount of the group 16 element per 1 mole of the total of Cu, In and Ga is preferably 0 to 10 equivalents, more preferably 0.5 to 4 equivalents, and still more preferably 1 to 2 equivalents.

The amount of the Lewis acid per 1 mol of Cu is preferably 0.1 to 50 mol, more preferably 1 to 20 mol, and still more preferably 2.5 to 8.5 mol.

In the preparation method (II), the method of mixing the raw materials is not particularly limited. Examples of the method for mixing include a method in which the raw materials are added to the Lewis base solvent, followed by stirring; and a method in which the raw materials are mixed together, followed by addition of the Lewis base solvent. Alternatively, a method in which the Lewis acid and optionally the group 16 element are added to the Lewis base solvent and stirred, followed by addition of the metal and/or metal compound is also preferable.

The amount of the solvent depends on the kind of raw materials used. However, the solvent is preferably used in an amount such that the solid content becomes 1 to 30% by weight, more preferably 5 to 20% by weight, provided that the solid content is the residual content after heating at 500° C. in a thermogravimetric analysis.

In the preparation method (II), the reaction temperature varies depending on the kind of raw materials used. However, in general, in terms of safety and stability of the complex, the reaction temperature is preferably from 0° C. to 200° C., more preferably from room temperature to 150° C., and still more preferably from room temperature to 100° C.

In the preparation method (II), the reaction time varies depending on the types of raw materials used, and the stirring time. However, in general, the reaction time is preferably from 1 hour to 2 weeks, more preferably from 1 day to 1 week, and still more preferably from 1 to 4 days.

<Preparation Method (III)>

As the metal and/or metal compound, the Lewis base solvent, the Lewis acid and the group 16 element usable in the preparation method (III), the same metal and/or metal compounds, Lewis base solvents, Lewis acids and group 16 elements as those described above in relation to the homogeneous coating solution can be used.

Preferable examples of the raw materials are the same as defined for the preparation method (I).

In the preparation method (III), a binary or ternary metal complex solution can be obtained, for example, by mixing together at least two kinds of metals and/or metal compounds, a Lewis base solvent, a Lewis acid and optionally a group 16 element.

Preferable examples of the raw materials are the same as defined for the preparation method (I).

The amount of each raw material can be appropriately adjusted depending on the types of raw materials used. For example, in the case of forming a CIGS layer (i.e., the homogeneous coating solution includes a compound represented by general formula (1) described later), at least two kinds of metals and/or metal compounds selected from the group consisting of Cu element and/or Cu compound, In element and/or In compound, and Ga element and/or Ga compound (hereafter, sometimes referred to collectively as "CIGS metals") can be used. In such a case, the homogeneous coating solution can be prepared such that the molar ratio of the metals falls under the range defined by general formula (1) described later.

When a group 16 element is used, the amount of the group 16 element per 1 mol of the total of CIGS metals is preferably 0 to 15 mol, more preferably 1 to 10 mol, and still more preferably 2 to 5 mol.

The amount of the Lewis acid per 1 mol of the total of CIGS metals is 0.1 to 50 mol, more preferably 1 to 20 mol, and still more preferably 2.5 to 8.5 mol.

In the preparation method (III), the method of mixing the raw materials is not particularly limited. Examples of the method for mixing include a method in which the raw materials are added to a Lewis base solvent, followed by stirring; and a method in which the raw materials are mixed together, followed by addition of a Lewis base solvent. Alternatively, a method in which the Lewis acid and optionally the group 16 element are added to the Lewis base solvent and stirred, followed by addition of the metal and/or metal compound is also preferable.

The amount of the solvent depends on the kind of raw materials used. However, the solvent is preferably used in an amount such that the solid content becomes 1 to 30% by weight, more preferably 5 to 20% by weight, provided that the solid content is the residual content after heating at 500° C. in a thermogravimetric analysis.

In the preparation method (III), the reaction temperature varies depending on the kind of raw materials used. However, in general, in terms of safety and stability of the complex, the reaction temperature is preferably from 0° C. to 200° C., more preferably from room temperature to 150° C., and still more preferably from room temperature to 100° C.

In the preparation method (III), the reaction time varies depending on the types of raw materials used, and the stirring time. However, in general, the reaction time is preferably from 1 hour to 2 weeks, more preferably from 1 day to 1 week, and still more preferably from 1 to 4 days.

In the present embodiment, the homogeneous coating solution is preferably used for forming a light-absorbing layer of a chalcopyrite solar cell. In such a case, the homogeneous coating solution preferably includes a compound represented by general formula (1) shown below.

[Chemical Formula 3]

$$Cu_w(In_{1-x}Ga_x)_y(A)_z \quad (1)$$

wherein $0 \leq w \leq 1$, $0 \leq x \leq 1$, $0 \leq y \leq 1$, $0 \leq z \leq 2$, and A is at least one group 16 element.

In general formula (1), $0 \leq w \leq 1$, preferably $0.75 \leq w \leq 1$. $0 \leq x \leq 1$, preferably $0.1 \leq x \leq 0.5$. $0 \leq y \leq 1$. $0 \leq z \leq 2$. A is at least one group 16 element, preferably Se and/or S.

In the present embodiment, the homogeneous coating solution may further include at least one member selected from the group consisting of Li, Na, K, Cs, Sb and Bi (hereafter, sometimes referred to collectively as "additive metal"). By virtue of including the additive metal, the crystal growth of the light-absorbing layer can be promoted.

As the additive metal, Na and/or Sb is preferable.

The additive metal may be dissolved in a Lewis base solvent, so as to be added to the homogeneous coating solution as a metal solution.

Examples of the Na solution include a solution obtained by dissolving sodium selenide and selenium in DMSO.

For example, in the case where the homogeneous coating solution is used for forming a light-absorbing layer of a CIGS solar cell, the amount of Na added is preferably from 0.1 to 10 atomic %, more preferably from 0.1 to 2 atomic %, based on the molar amount of the CIGS metals. Alternatively, the amount of Sb added is preferably from 0.1 to 2 atomic %, more preferably from 0.1 to 0.5 atomic %, based on the molar amount of the CIGS metals.

In the present embodiment, since no hydrazine is used in the homogeneous coating solution, the safety in process is improved. Further, in the present embodiment, the homogeneous coating solution can be prepared with ease at a low cost. In addition, in the present embodiment, since no organic ligand is used in the homogeneous coating solution, a light-absorbing layer can be formed in which the amount of organic substance that becomes a cause of inhibiting the crystal growth is reduced. Furthermore, the homogeneous coating solution according to the present embodiment exhibits excellent storage stability, e.g., the homogeneous coating solution can be stably stored for at least 2 month without precipitation of a metal compound.

[Light-Absorbing Layer for Solar Cell, and Production Method Thereof]

The light-absorbing layer for solar cell according to the present embodiment is formed using the homogeneous coating solution of the present embodiment.

The method of forming a light absorbing layer of a solar cell according to the present embodiment is the same as the step of forming a light absorbing layer in the method of forming a solar cell according to the present embodiment.

[Solar Cell and Production Method Thereof]

The solar cell according to the present embodiment includes the light-absorbing layer for solar cell according to the present embodiment.

The method of producing a solar cell according to the present embodiment includes: forming a first electrode on a substrate; applying a homogeneous coating solution according to the present embodiment to the first electrode, followed by baking to form a light absorbing layer; forming a buffer layer on the light absorbing layer; and forming a second electrode on the buffer layer.

In the method of forming a solar cell according to the present invention, the steps other than the step of forming a light-absorbing layer on the first electrode can be performed by any conventional method. For example, the step of forming a first electrode on a substrate can be performed by a sputtering method using nitrogen as a sputtering gas, and forming a film layer such as an Mo layer. The buffer layer can be formed as a CdS layer by, for example, a chemical bath deposition method. The second electrode can be formed as a transparent electrode using an appropriate material.

In the formation of a light-absorbing layer, firstly, a homogeneous coating solution according to the present embodiment is applied to the first electrode (base). The application of the coating solution can be conducted by a spin-coat method, a dip-coat method, a doctor-blade (applicator) method, a curtain-slit cast method, a printing method, a spraying method or the like. In the present embodiment, in terms of mass production, it is preferable to use a non-spin coat method.

The application conditions can be appropriately selected depending on the desired film thickness, concentration of the materials and the like.

For example, in a spin-coating method, the base is set on a spin coater, followed by applying the homogeneous coating solution to the base. The application conditions can be appropriately selected depending on the film thickness. For example, the application can be performed at a rotation speed of 300 to 3,000 rpm for 10 to 180 seconds. The application can be repeatedly performed until a desired thickness is obtained.

Alternatively, in a non-spin coating method, the homogeneous coating solution is applied from a slit nozzle having a rectangular ejection nozzle. The number of times the application is conducted is not particularly limited, preferably 1 to 10 times, and more preferably 1 to 5 times.

In a dipping method, the base can be dipped in a container containing the homogeneous coating solution. The dipping can be performed once, or a plurality of times.

After applying the homogeneous coating solution for forming a light absorbing layer on the base, a vacuum drying may be performed.

Subsequently, after applying the homogeneous coating solution on the support, the support is baked to form a light-absorbing layer.

The baking conditions can be appropriately selected depending on the desired film thickness, the type of materials used, and the like. For example, the baking can be performed in 2 steps, namely, performing a soft bake on a hot plate (prebake), followed by baking in an oven (annealing).

In such a case, for example, the base may be set and held on a hot plate, followed by raising the temperature of the hot plate to 100 to 500° C. to perform the soft bake for 1 to 300 seconds. Then, the base is cooled to room temperature, and application is performed again. After obtaining the desired film thickness, the hot plate or the inside of the oven is heated to 300 to 700° C. and maintained for 1 to 180 minutes to perform the annealing.

As a result, the light-absorbing layer is cured.

The baking temperatures described above are merely one example of the baking conditions, and the baking conditions are not particularly limited. For example, the temperature of the hot plate can be raised in a stepwise manner, and the heating may be performed in an inert gas atmosphere in a glove box. Further, soft bake or anneal may be performed in an atmosphere in the presence of hydrogen sulfide, hydrogen selenide, solid sulfur or solid selenium. However, in the present embodiment, by using, as the Lewis acid, a compound functioning as a chalcogen source, a light-absorbing layer having a desired structure (such as a chalcopyrite structure) can be formed even when soft bake and/or annealing is conducted in an atmosphere absent of hydrogen sulfide, hydrogen selenide, solid sulfur, solid selenium or the like.

In the present embodiment, the solar cell is preferably a chalcopyrite solar cell. In such a case, the light-absorbing layer preferably includes a compound represented by the aforementioned general formula (1).

In the case where two or more metal complex solutions prepared by the preparation method (III) is used, a first complex solution may be applied to the base, followed by baking to form a first layer, and then a second complex solution having a different metal composition from that of the first complex solution may be applied to the first layer, followed by baking to form a second layer. Thereafter, the first and second layers may be annealed to thereby form a single light-absorbing layer having a desired composition, or a multilayer-structured light-absorbing layer having a desired gradation in the metal composition ratios. In such a case, it is expected that the arrangement of the metal in the light-absorbing layer can be reliably designed, and the structure of the light-absorbing layer can be reliably controlled.

However, it should be noted that stacking of complex solutions (coating films) with different compositions is not limited to the case where the complex solutions are prepared by the preparation method (III). Even when complex solutions are prepared by the preparation methods (I) and/or (II), complex solutions with different compositions can be stacked in any desired order. In this manner, a flexible design of composition profile within the coating film can be facilitated.

In this manner, a solar cell according to the present embodiment can be produced. Since the solar cell produced by the method of the present embodiment contains no hydrazine in the homogeneous coating solution, the safety of the production process can be improved. In addition, since no organic ligand is used in the homogeneous coating solution, the amount of organic substance that becomes a cause of inhibiting the crystal growth is reduced in the light-absorbing layer. As a result, an excellent crystal growth can be obtained.

Hereinabove, the present invention has been explained based on the aforementioned embodiments. Needless to say, the present invention is not limited to the aforementioned embodiments, and various modifications can be made without departing from the spirit or scope of the present invention.

In the aforementioned embodiment, explanation was given taking example of the preparation method (I), the preparation method (II) and the preparation method (III) as the method for producing a homogeneous coating solution. However, the present invention is not limited thereto. For example, with respect to a portion of the metal components, a metal precursor may be prepared, and the prepared metal precursor, the other metal component(s), the Lewis base solvent, the Lewis acid, optionally the group 16 element and any other desired components may be mixed together. Further, for example, in the preparation method (II), part of the raw materials may be mixed together in advance, and the remainder of the raw materials may be added thereto.

EXAMPLES

As follows is a description of examples of the present invention, although the scope of the present invention is by no way limited by these examples.

[Production of Homogeneous Coating Solution]

Example 1

1.536 g (48.00 mmol) of S (sulfur), 22.00 g of DMSO (dimethylsulfoxide) and 6.204 g (102.00 mmol in terms of NH$_3$) of a 28 wt % aqueous NH$_3$ solution were mixed together, followed by stirring at room temperature over one night.

To the obtained reaction liquid were added 1.208 g (10.50 mmol) of In, 0.315 g (4.50 mmol) of Ga and 0.4425 g (6.75 mmol) of Cu, followed by stirring at room temperature for 4 days. Thereafter, 0.4425 g (6.75 mmol) of Cu was added, followed by stirring at room temperature for 2 days, thereby obtaining homogeneous coating solution 1.

Example 2

1.600 g (50.00 mmol) of S, 22.00 g of DMSO and 8.095 g (50.00 mmol in terms of S) a 42% of aqueous (NH$_4$)$_2$S solution were mixed together, followed by stirring at room temperature for 6 hours.

To the obtained reaction liquid were added 1.208 g (10.50 mmol) of In, 0.315 g (4.50 mmol) of Ga and 0.4425 g (6.75 mmol) of Cu, followed by stirring at room temperature for 1 day, and further stirring at 70° C. for 3 days. Thereafter, 0.4425 g (6.75 mmol) of Cu was added, followed by stirring at 70° C. for 1 day, thereby obtaining homogeneous coating solution 2.

Example 3

1.536 g (48.00 mmol) of S, 22.00 g of DMSO, 6.204 g (102.00 mmol in terms of NH$_3$) of a 28% aqueous NH$_3$ solution and 1.943 g (12.00 mmol in terms of S) of a 42% aqueous (NH$_4$)$_2$S solution were mixed together, followed by stirring at room temperature for 6 hours.

To the obtained reaction liquid were added 1.208 g (10.50 mmol) of In, 0.315 g (4.50 mmol) of Ga and 0.4425 g (6.75 mmol) of Cu, followed by stirring at room temperature for 1 day, and further stirring at 70° C. for 3 days. Thereafter, 0.4425 g (6.75 mmol) of Cu was added, followed by stirring at 70° C. for 2 days, thereby obtaining homogeneous coating solution 3.

Example 4

3.948 g (50.00 mmol) of Se, 23.00 g of DMSO and 8.095 g (50.00 mmol in terms of S) a 42% of aqueous (NH$_4$)$_2$S solution were mixed together, followed by stirring at room temperature for 6 hours.

To the obtained reaction liquid were added 1.208 g (10.50 mmol) of In, 0.420 g (6.00 mmol) of Ga and 0.4425 g (6.75 mmol) of Cu, followed by stirring at room temperature over one night, and further stirring at 70° C. for 4 days. Thereafter, 0.4425 g (6.75 mmol) of Cu was added, followed by stirring at 70° C. for 1 day, thereby obtaining homogeneous coating solution 4.

Example 5

3.790 g (48.00 mmol) of Se, 22.50 g of DMSO, 6.204 g (102.00 mmol in terms of NH$_3$) of a 28% aqueous NH$_3$ solution and 1.943 g (12.00 mmol in terms of S) of a 42% aqueous (NH$_4$)$_2$S solution were mixed together, followed by stirring at room temperature over one night.

To the obtained reaction liquid were added 1.208 g (10.50 mmol) of In, 0.315 g (4.500 mmol) of Ga and 0.297 g (4.67 mmol) of Cu, followed by stirring at room temperature for 6 hours, and further stirring at 70° C. for 2 days. Thereafter, 0.593 g (9.33 mmol) of Cu was added, followed by stirring at room temperature for 2 days, thereby obtaining homogeneous coating solution 5.

Example 6

3.790 g (48.00 mmol) of Se, 22.50 g of DMSO, 6.204 g (102.00 mmol in terms of NH$_3$) of a 28% aqueous NH$_3$ solution and 1.943 g (12.00 mmol in terms of S) of a 42% aqueous (NH$_4$)$_2$S solution were mixed together, followed by stirring at room temperature over one night.

To the obtained reaction liquid was added 0.6355 g (10.0 mmol) of Cu, followed by stirring at room temperature for 24 hours. Thereafter, 0.6355 g (10.0 mmol) of Cu was added, followed by stirring at room temperature for 2 days, thereby obtaining homogeneous coating solution 6.

Example 7

3.948 g (50.00 mmol) of Se, 23.00 g of DMSO and 1.538 g (9.5 mmol in terms of S) a 42% of aqueous (NH$_4$)$_2$S solution were mixed together, followed by stirring at room temperature for 6 hours.

To the obtained reaction liquid were added 1.208 g (10.50 mmol) of In, and 0.315 g (4.5 mmol) of Ga, followed by stirring at room temperature over one night, and further stirring at 70° C. for 4 days. Thereafter, 0.4425 g (6.75 mmol) of Cu was added, followed by stirring at 70° C. for 1 day, thereby obtaining homogeneous coating solution 7.

Example 8

12.00 g of DMSO and 2.429 g (15.0 mmol in terms of S) a 42% of aqueous (NH$_4$)$_2$S solution were mixed together, followed by stirring at room temperature for 24 hours.

To the obtained reaction liquid were added 0.086 g (1.5 mmol) of Cu, 0.345 g (3.0 mmol) of In, and 0.105 g (1.5 mmol) of Ga, followed by stirring at room temperature over one night, and further stirring at 70° C. for 4 days. Thereafter, 0.086 g (1.5 mmol) of Cu was added, followed by stirring at 70° C. for 1 day, thereby obtaining homogeneous coating solution 8.

[ICP Measurement]

Each of the homogeneous coating solutions 1 to 5 obtained in Examples 1 to 5 was dissolved in aqua regia, followed by diluting with water and conducting an ICP measurement. From the ICP measurement results, the molar ratio of Cu, In and Ga was calculated. The results are shown in Table 1.

TABLE 1

| | Molar ratio of raw material | | | Molar ratio after ICP measurement | | |
| --- | --- | --- | --- | --- | --- | --- |
| | Cu (Molar ratio) | In (Molar ratio) | Ga (Molar ratio) | Cu (Molar ratio) | In (Molar ratio) | Ga (Molar ratio) |
| Example 1 | 0.900 | 0.700 | 0.300 | 0.849 | 0.735 | 0.265 |
| Example 2 | 0.900 | 0.700 | 0.300 | 2.118 | 0.890 | 0.110 |
| Example 3 | 0.900 | 0.700 | 0.300 | 0.957 | 0.696 | 0.304 |
| Example 4 | 0.820 | 0.640 | 0.360 | 0.804 | 0.638 | 0.362 |
| Example 5 | 0.930 | 0.700 | 0.300 | 1.115 | 0.652 | 0.348 |

From the results shown in Table 1, it was confirmed that, in the homogeneous coating solutions 1 to 5, the molar ratio of each metal has not been greatly varied from the molar ratio of the raw material. In particular, in the homogeneous coating solutions 1, 3 and 4, it was confirmed that the molar ratio of each metal hardly changed from the molar ratio of the raw material, such that the metal composition of the homogeneous solution could be controlled.

Example 9

The same procedure as in Example 4 was conducted, except that the amount of In, Ga and Cu were changed to In 1.035 g (9.0 mmol), Ga 0.420 g (6.0 mmol) and Cu 1.082 g (16.5 mmol), respectively, thereby obtaining homogeneous coating solution 9-1.

Separately from the above, the same procedure as in Example 4 was conducted, except that the amount of In, Ga and Cu were changed to 1.380 g (12.0 mmol), 0.210 g (3.0 mmol) and 0.787 g (12.0 mmol), respectively, thereby obtaining homogeneous coating solution 9-2.

Subsequently, 6.0 g of homogeneous coating solution 9-1 and 6.0 g of homogeneous coating solution 9-2 were mixed together and stirred at room temperature for 1 hour, thereby obtaining homogeneous coating solution 9.

With respect to the homogeneous coating solutions 9-1, 9-2 and 9, the ICP measurement was conducted in the same manner as described above. The results are shown in Table 2 below.

Example 10

0.508 g (8.0 mmol) of Cu, 1.208 g (10.5 mmol) of In, 0.105 g (1.5 mmol) of Ga, 4.501 g (57.00 mmol) of Se, 27.00 g of DMSO and 10.4 g of $NH_3$ aqueous solution (28%) were mixed together, followed by stirring at room temperature for 6 hours. Then, the resultant was further stirred 70° C. for 1 day, and followed by sonication for 1 hour, thereby obtaining homogeneous coating solution 10.

With respect to the homogeneous coating solution 10, the ICP measurement was conducted in the same manner as described above. The results are shown in Table 2 below.

Comparative Example 1

A CIGS coating solution was prepared with reference to WO2011/013657. 4.949 g (47.1 mmol) of benzeneselenol and 3.726 g (47.1 mmol) of pyridine were mixed together to prepare a mixed solvent. To the mixed solvent were added 0.230 g (3.619 mmol) of Cu, 0.320 g (2.787 mmol) of In and 0.130 g (1.865 mmol) of Ga such that the solid content became 14%, and the metal ratio became Cu/(In+Ga)=0.78, In/(In+Ga)=0.60, Ga/(In+Ga)=0.40, and 0.720 g (9.119 mmol) of Se, followed by stirring at room temperature for 2 weeks, thereby obtaining comparative homogeneous coating solution 1.

The metal ratio of the supernatant of the obtained solution was confirmed by ICP. As a result, it was found that Cu/(In+Ga)=0.93, In/(In+Ga)=0.62, Ga/(In+Ga)=0.38.

TABLE 2

| Homogeneous coating solution | Cu/(In + Ga) | In/(In + Ga) | Ga/(In + Ga) |
| --- | --- | --- | --- |
| Solution 9-1 | 1.090 | 0.594 | 0.406 |
| Solution 9-2 | 0.775 | 0.795 | 0.205 |
| Solution 9 | 0.940 | 0.702 | 0.298 |
| Solution 10 | 0.485 | 0.69 | 0.31 |
| Comparative solution 1 | 0.93 | 0.62 | 0.38 |

[TGA Analysis]

With respect to the homogeneous coating solutions 4 and 7 obtained in Examples 4 and 7, a thermogravimetric analysis (TGA) was performed using TGA 2950 (manufactured by TA Instruments) at a temperature rise rate of 2° C./min. As a result, it was confirmed that excess Se or S is removed by rise in temperature.

<Formation of Light Absorbing Layer>

Examples 11 to 16

The homogeneous coating solution 9 prepared in Example 9 was applied to a glass substrate having Mo deposited thereon, followed by soft bake at 325° C. for 2 minutes. This step was conducted 15 times in total. Then, annealing was conducted under the conditions indicated in Table 3 in the presence of a small amount of selenium, thereby obtaining a CIGS substrate having a CIGS layer formed.

Each of the thus produced CIGS substrate was observed using a scanning electron microscope (SEM). As a result, grain growth of CIGS was confirmed. Further, it was confirmed that a uniform single layer was formed.

Example 17

The homogeneous coating solution 9-1 prepared in Example 9 was applied to a glass substrate having Mo deposited thereon, followed by soft bake at 325° C. for 2 minutes. This step was conducted 15 times in total. Then, annealing was conducted at 560° C. for 40 minutes in the presence of a small amount of selenium, thereby obtaining a CIGS substrate having a CIGS layer formed.

The thus produced CIGS substrate was observed using a scanning electron microscope (SEM). As a result, grain growth of CIGS was confirmed. Further, it was confirmed that a uniform single layer was formed.

Example 18

The homogeneous coating solution 9-2 prepared in Example 9 was applied to a glass substrate having Mo deposited thereon, followed by soft bake at 325° C. for 2 minutes. This step was conducted 15 times in total. Then, annealing was conducted at 560° C. for 40 minutes in the presence of a small amount of selenium, thereby obtaining a CIGS substrate having a CIGS layer formed.

The thus produced CIGS substrate was observed using a scanning electron microscope (SEM). As a result, grain growth of CIGS was confirmed. Further, it was confirmed that a uniform single layer was formed.

Example 19

The homogeneous coating solution 10 prepared in Example 10 was applied to a glass substrate having Mo deposited thereon, followed by soft bake at 325° C. for 2 minutes. This step was conducted 15 times in total. Then, annealing was conducted at 560° C. for 40 minutes in the presence of a small amount of selenium, thereby obtaining a CIGS substrate having a CIGS layer formed.

The thus produced CIGS substrate was observed using a scanning electron microscope (SEM). As a result, grain growth of CIGS was confirmed. Further, it was confirmed that a uniform layer with several grains stacked was formed.

TABLE 3

| | Homogeneous solution | Annealing temperature (° C.) | Annealing time (min) |
|---|---|---|---|
| Example 11 | 9 | 560 | 60 |
| Example 12 | 9 | 540 | 60 |
| Example 13 | 9 | 530 | 60 |
| Example 14 | 9 | 560 | 20 |
| Example 15 | 9 | 540 | 20 |
| Example 16 | 9 | 520 | 20 |
| Example 17 | 9-1 | 560 | 40 |
| Example 18 | 9-2 | 560 | 40 |
| Example 19 | 10 | 560 | 40 |

Example 20

A CIGS substrate having a CIGS layer formed was prepared in the same manner as in Example 11, except that the annealing time was changed to 50 minutes, and annealing was conducted in the absence of selenium.

The thus produced CIGS substrate was observed using a scanning electron microscope (SEM). As a result, grain growth of CIGS was confirmed, despite that the annealing was conducted in the absence of selenium. Further, it was confirmed that a uniform single layer was formed.

Example 21

A CIGS substrate was formed in the same manner as in Example 11, except that homogeneous coating solution 4 was used instead of homogeneous coating solution 9, and annealing was conducted at 560° C. for 50 minutes in the absence of selenium.

Example 22

A CIGS substrate was formed in the same manner as in Example 21, except that annealing was conducted in the presence of a small amount of selenium.

Comparative Example 2

The comparative homogeneous coating solution 1 prepared in Comparative Example 1 was applied to a glass substrate having Mo deposited thereon, followed by soft bake at 120° C. for 1 minute and at 300° C. for 3 minutes. Then, annealing was conducted at 540° C. for 30 minutes in the presence of a small amount of selenium, thereby obtaining a CIGS substrate having a CIGS layer formed.

Comparative Example 3

The comparative homogeneous coating solution 1 prepared in Comparative Example 1 was applied to a glass substrate having Mo deposited thereon, followed by soft bake at 120° C. for 1 minute and at 300° C. for 3 minutes. This step was conducted 2 times in total. Then, annealing was conducted at 540° C. for 30 minutes in the presence of a small amount of selenium, thereby obtaining a CIGS substrate having a CIGS layer formed.

[Raman Spectroscopy]

With respect to the CIGS substrates formed in Examples 21 and 22 and Comparative Examples 2 and 3, raman spectroscopy was conducted. As a result, with respect to the CIGS substrates of Examples 21 and 22, no peak was observed in the vicinity of 1,500 cm$^{-1}$, and hence, it was confirmed that no carbon component remained in the CIGS films. On the other hand, with respect to the CIGS substrates of Comparative Examples 2 and 3, a peak was observed in the vicinity of 1,500 cm$^{-1}$, and hence, it was confirmed that carbon component was remaining in the CIGS films.

[XRD Analysis]

Each of the CIGS substrates produced in Examples 11 and 20 was subjected to an XRD measurement. As a result, at about $2\theta=27°$, $45°$ and $52$ to $53°$, significant peaks ascribed to CIGS on (112) plane, (220)/(204) plane and (312)/(116) plane were observed, respectively. These results showed good consistency with conventionally known results of CIGS films (Souilah, M., Lafond, A., Guillot Deudon, C., Harel, S., Evain, M. J. Solid State Chem. 183 (2010) 2274). Thus, it was confirmed that a CIGS film was formed.

The invention claimed is:

1. A homogeneous coating solution for forming a light-absorbing layer of a solar cell, the homogeneous solution comprising:
   at least one metal or metal compound selected from the group consisting of Cu element, Ag element, Al element, Ga element, In element, $Cu(OH)_2$, CuO, $Cu_2O$, silver oxide, $In(OH)_3$, indium oxide and gallium oxide;
   a Lewis base solvent; and
   a Lewis acid,
   the homogeneous coating solution containing no hydrazine, and
   the at least one metal or metal compound and the Lewis acid being homogeneously dissolved over the entire Lewis base solvent.

2. The homogeneous coating solution according to claim 1, wherein the solar cell is a chalcopyrite solar cell.

3. The homogeneous coating solution according to claim 1, which comprises a compound represented by general formula (1) shown below:

$$Cu_w(In_{1-x}Ga_x)_y(A)_z \qquad (1)$$

wherein $0 \leq w \leq 1$, $0 \leq x \leq 1$, $0 \leq y \leq 1$, $0 \leq z \leq 2$, and A is at least one group 16 element.

4. The homogeneous coating solution according to claim 1, wherein the Lewis base solvent is an aprotic solvent.

5. The homogeneous coating solution according to claim 4, wherein the aprotic solvent is at least one member selected from the group consisting of dimethylsulfoxide, pyridine, tetramethylurea, tetrahydrofuran, ethyl acetate, acetone, dimethylformamide, acetonitrile, dichloromethane, dimethylacetoamide, N-methylpyrrolidone and N-methylimidazole.

6. The homogeneous coating solution according to claim 1, wherein the Lewis acid is an onium salt.

7. The homogeneous coating solution according to claim 6, wherein the Lewis acid is an ammonium salt.

8. The homogeneous coating solution according to claim 7, wherein the ammonium salt is at least one member selected from the group consisting of ammonium hydroxide, ammonium sulfide, ammonium chloride, ammonium carbonate, ammonium selenide, ammonium thiocyanate, ammonium acetate, ammonium carbamate, ammonium formate, ammonium hexafluorophosphate, ammonium hydrogen difluoride and ammonium nitrate.

9. The homogeneous coating solution according to claim 1, which further comprises a group 16 element.

10. The homogeneous coating solution according to claim 9, wherein the group 16 element is at least one member selected from the group consisting of S and Se.

11. The homogeneous coating solution according claim 1, further comprising at least one member selected from the group consisting of Li, Na, K, Cs, Sb and Bi.

12. A light-absorbing layer of a solar cell formed by using the homogeneous coating solution according to claim 1.

13. A solar cell comprising the light-absorbing layer of claim 12.

14. A method of producing a homogeneous coating solution for forming a light-absorbing layer of a solar cell, the method comprising:
mixing together at least one metal or metal compound selected from the group consisting of Cu element, Ag element, Al element, Ga element, In element, $Cu(OH)_2$, CuO, $Cu_2O$ silver oxide, $In(OH)_3$, indium oxide and gallium oxide, a Lewis base solvent, and a Lewis acid and no hydrazine, to obtain a homogeneous coating solution in which the at least one metal or metal compound and the Lewis acid being homogeneously dissolved over the entire Lewis base solvent.

15. The method according to claim 14, wherein the solar cell is a chalcopyrite solar cell.

16. The method according to claim 14 or 15, wherein the homogeneous coating solution comprises a compound represented by general formula (1) shown below:

$$Cu_w(In_{1-x}Ga_x)_y(A)_z \qquad (1)$$

wherein $0 \leq w \leq 1$, $0 \leq x \leq 1$, $0 \leq y \leq 1$, $0 \leq z \leq 2$, and A is at least one group 16 element.

17. The method according to claim 14, wherein the Lewis base solvent is an aprotic solvent.

18. The method according to claim 17, wherein the aprotic solvent is at least one member selected from the group consisting of dimethylsulfoxide, pyridine, tetramethylurea, tetrahydrofuran, ethyl acetate, acetone, dimethylformamide, acetonitrile, dichloromethane, dimethylacetoamide, N-methylpyrrolidone and N-methylimidazole.

19. The method according to claim 14, wherein the Lewis acid is an onium salt.

20. The method according to claim 19, wherein the Lewis acid is an ammonium salt.

21. The method according to claim 20, wherein the ammonium salt is at least one member selected from the group consisting of ammonium hydroxide, ammonium sulfide, ammonium chloride, ammonium carbonate, ammonium selenide, ammonium thiocyanate, ammonium acetate, ammonium carbamate, ammonium formate, ammonium hexafluorophosphate, ammonium hydrogen difluoride and ammonium nitrate.

22. The method according to claim 14, further comprising mixing a group 16 element.

23. The method according to claim 22, wherein the group 16 element is at least one member selected from the group consisting of S and Se.

24. The method according to claim 14, further comprising adding at least one member selected from the group consisting of Li, Na, K, Cs, Sb and Bi.

25. A method of forming a light-absorbing layer of a solar cell, the method comprising:
applying a homogeneous coating solution obtained by the method according to claim 14 to a base, followed by baking.

26. A method of producing a solar cell, the method comprising:
forming a first electrode on a substrate;
applying a homogeneous coating solution obtained by the method according to claim 14 to the first electrode, followed by baking to form a light-absorbing layer;
forming a buffer layer on the light-absorbing layer; and
forming a second electrode on the buffer layer.

* * * * *